(12) United States Patent
Yen

(10) Patent No.: US 10,777,928 B1
(45) Date of Patent: Sep. 15, 2020

(54) ELECTRICAL CONNECTOR WITH EXTENSION TERMINALS

(71) Applicant: Hsu Li Yen, Sinjhuang (TW)

(72) Inventor: Hsu Li Yen, Sinjhuang (TW)

(*) Notice: Subject to any disclaimer, the term of this patent is extended or adjusted under 35 U.S.C. 154(b) by 0 days.

(21) Appl. No.: 16/595,632

(22) Filed: Oct. 8, 2019

(51) Int. Cl.
| | |
|---|---|
| H01R 13/24 | (2006.01) |
| H01R 13/11 | (2006.01) |
| H01R 12/71 | (2011.01) |
| H01R 13/631 | (2006.01) |
| H01R 13/422 | (2006.01) |

(52) U.S. Cl.
CPC ....... *H01R 13/2471* (2013.01); *H01R 12/714* (2013.01); *H01R 13/11* (2013.01); *H01R 13/2421* (2013.01); *H01R 13/422* (2013.01); *H01R 13/6315* (2013.01)

(58) Field of Classification Search
CPC ............... H01R 13/2471; H01R 13/11; H01R 13/2421; H01R 13/422; H01R 13/6315; H01R 12/714
USPC .................................. 439/700, 66, 74, 81, 82
See application file for complete search history.

(56) References Cited

U.S. PATENT DOCUMENTS

| | | | | |
|---|---|---|---|---|
| 4,904,213 A * | 2/1990 | Hock ..................... | G01R 1/067 | 439/482 |
| 6,213,787 B1 * | 4/2001 | Murphy ............... | H01R 13/187 | 361/767 |
| 6,814,626 B2 * | 11/2004 | Wen-Yao ........... | H01R 13/7036 | 439/515 |
| 6,861,862 B1 * | 3/2005 | Tate ..................... | G01R 1/0466 | 324/756.02 |
| 7,300,288 B1 * | 11/2007 | Chen .................. | H01R 13/2421 | 439/654 |
| 7,467,952 B2 * | 12/2008 | Hsiao ................. | H01R 13/2421 | 439/66 |
| 7,559,769 B2 * | 7/2009 | Hsiao ................... | H05K 7/1069 | 439/66 |
| 7,690,925 B2 * | 4/2010 | Goodman ............ | H05K 7/1061 | 361/813 |
| 7,841,864 B2 * | 11/2010 | Hsiao ................. | H01R 13/2421 | 439/66 |
| 8,062,078 B2 * | 11/2011 | Asai .................... | H01R 13/2421 | 439/482 |
| 8,353,730 B1 * | 1/2013 | Wang ................. | H01R 13/2421 | 439/515 |

(Continued)

*Primary Examiner* — Harshad C Patel
(74) *Attorney, Agent, or Firm* — Rosenberg, Klein & Lee

(57) ABSTRACT

An electrical connector with extension terminals includes an insulating housing, a movable terminal, a spring and a conductive reed terminal. The insulating housing has terminal axial holes each having a ridge. The insulating housing has reed sockets arranged around and communicated with the terminal axial holes. The movable terminal accommodates therein a spring. The movable terminal has a groove. The movable terminal is such inserted into the terminal axial hole of the insulating housing that the groove fittingly receives the ridge, thereby limiting the movable terminal to move in the terminal axial hole but preventing the movable terminal from leaving from and rotating in the terminal axial hole. The conductive reed terminal has inserts and a weld leg. The insert has a reed. When the insert is inserted into the reed socket, the reed abuts against the movable terminal, thereby establishing conductivity therebetween.

1 Claim, 4 Drawing Sheets

(56) References Cited

U.S. PATENT DOCUMENTS 10,468,804 B2 * 11/2019 Kawamura ............ H01R 13/15
10,535,942 B2 * 1/2020 Sugiura ................. H01R 13/03

* cited by examiner

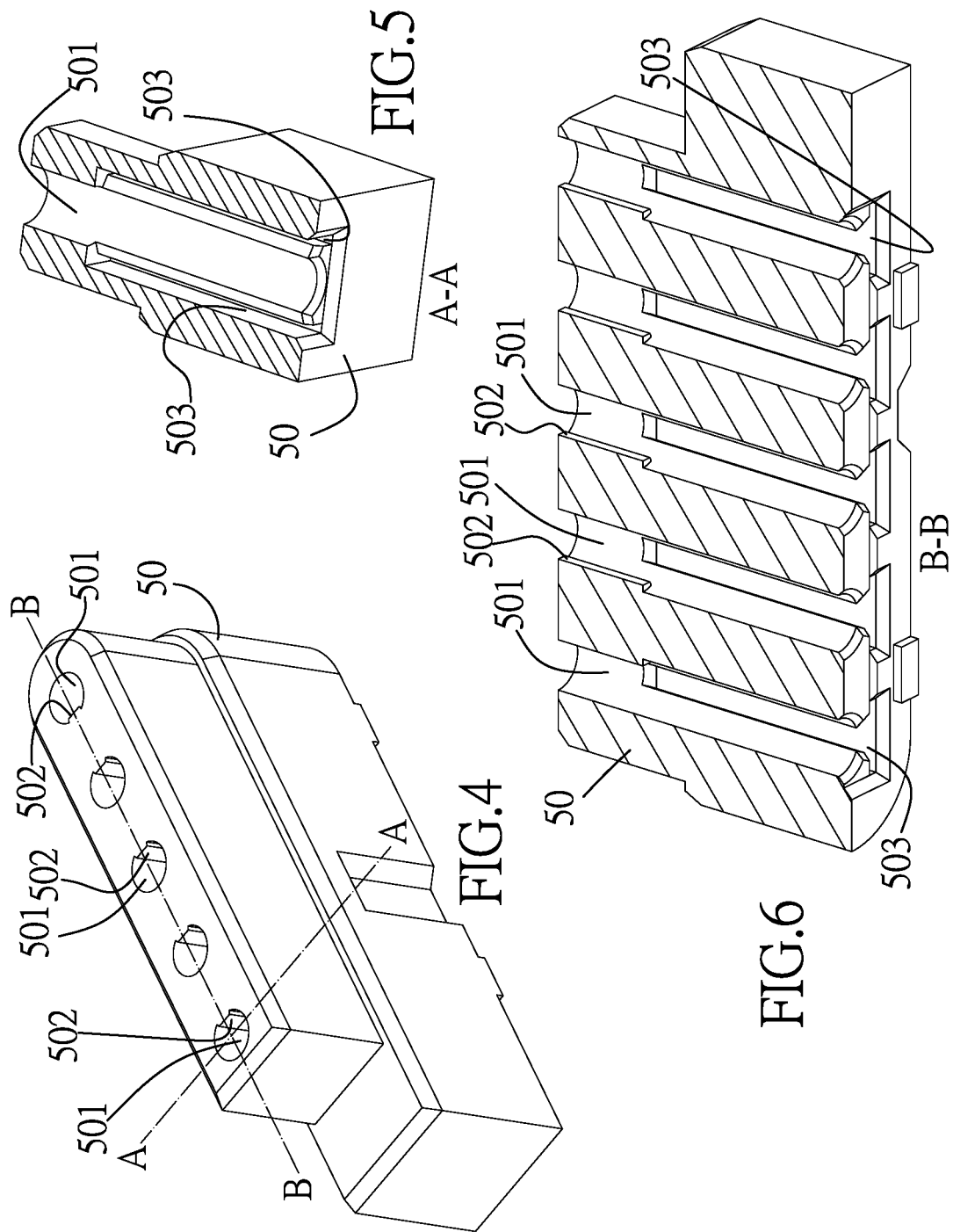

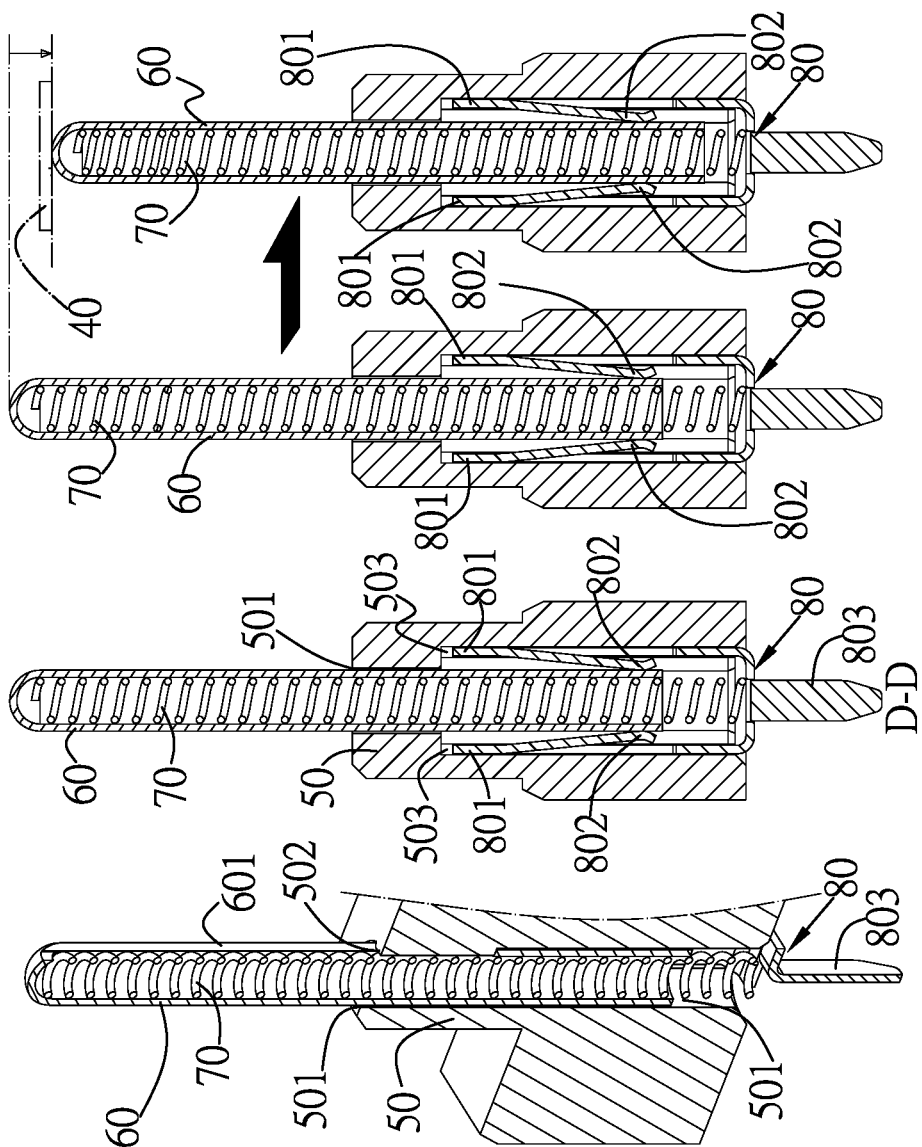

ELECTRICAL CONNECTOR WITH EXTENSION TERMINALS

BACKGROUND OF THE INVENTION

1. Technical Field

The present invention relates to the field of electrical connectors, and more particularly to movable extension terminals of an electrical connector.

2. Description of Related Art

FIG. 1 is a cross-sectional view of a conventional electrical connector with extension terminals. As shown, the electrical connector 10 comprises an insulating housing 20 containing therein extension terminals 30. Each of the extension terminals 30 has a sleeve 301. The sleeve 301 is atop provided with a slightly reduced bore and defines a hollow space for allowing a spring 303 and a contact needle 302 that has a columnar shaft 302a to move back and forth therein. The columnar shaft 302a of the contact needle 302 is biased by the spring 303 so that the contact needle 302 normally stays at its standby position where it stretch out of the sleeve 301 at the bore.

In operation, the extension terminal 30 of the electrical connector 10 abuts against a contact 40 that enables electrical connection with an external device at so as to establish electrical conductivity. At this time, the contact needle 302 is pressed inward the sleeve while the columnar shaft 302a of the contact needle 302 is pushed outward the sleeve under the counter-compression force of the spring 303, so as to ensure firm contact and in turn reliable conductivity between the contact needle 302 and the contact 40 of the external device.

However, since the extension terminal 30 is a tiny component and the sleeve 301 has a very thin wall, plus the fact that the columnar shaft 302a of the contact needle 302 moves back and forth in the sleeve 301 along an off-axis path, the inner wall of the sleeve 301 tends to wear after repeated use, resulting in the enlarged inner diameter and rough inner surface of the sleeve 301. Consequently, the columnar shaft 302a of the contact needle 302 when moving in the sleeve 301 can become more off-axis and experience more friction drag. Eventually, the contact needle 302 will be no more able to move back and forth and will even stick in the sleeve 301, making it impossible to firmly abut against and establish conductivity with the contact 40 of the external device.

BRIEF SUMMARY OF THE INVENTION

The present invention provides an electrical connector with extension terminals, which comprises an insulating housing, a movable terminal, a spring and a conductive reed terminal. The insulating housing is formed with terminal axial holes passing therethrough according to a specification of the electrical connector in terms of terminal quantity and terminal arrangement. Each said terminal axial hole has an upper part of its wall formed with a ridge. The insulating housing at its bottom is provided with a plurality of reed sockets arranged around and communicated with the terminal axial holes, respectively.

The movable terminal has a tubular body accommodating therein a spring. The movable terminal has a domed top formed as an abutting portion. The movable terminal is further provided with a groove. The movable terminal is configured to be such inserted into the terminal axial hole of the insulating housing that the groove of the movable terminal fittingly receives the ridge at the wall of the terminal axial hole of the insulating housing, thereby limiting the movable terminal to move in the terminal axial hole but preventing the movable terminal from leaving from and rotating in the terminal axial hole.

The conductive reed terminal is formed from a metal sheet and having a plurality of inserts and a weld leg. The insert has a reed. When the insert of the conductive reed terminal is inserted into the reed socket of the insulating housing, the reed of the insert of the conductive reed terminal abuts against the movable terminal, thereby establishing conductivity therebetween. The reed has resilience and thus can continuously counteract the push force generated by the movable terminal moving back and forth along the slightly off-axis path and firmly abut against the movable terminal, so as to ensure firm contact and reliable conductivity, thereby preventing the movable terminal from getting stuck and being not able to move up and down.

BRIEF DESCRIPTION OF THE SEVERAL VIEWS OF THE DRAWINGS

FIG. 4 is a perspective view of an insulating housing of the electrical connector according to the present invention;

FIG. 5 is a cross-sectional view taken along Line A-A of FIG. 4;

FIG. 6 is a cross-sectional view taken along Line B-B of FIG. 4;

FIG. 7 is a perspective view of the electrical connector with extension terminals according to the present invention;

FIG. 8 is a cross-sectional view taken along Line C-C of FIG. 7;

FIG. 9 is a cross-sectional view taken along Line D-D of FIG. 7; and

FIG. 10 is a schematic drawing showing operation of the electrical connector with extension terminals according to the present invention.

DETAILED DESCRIPTION OF THE INVENTION

Figure 1:
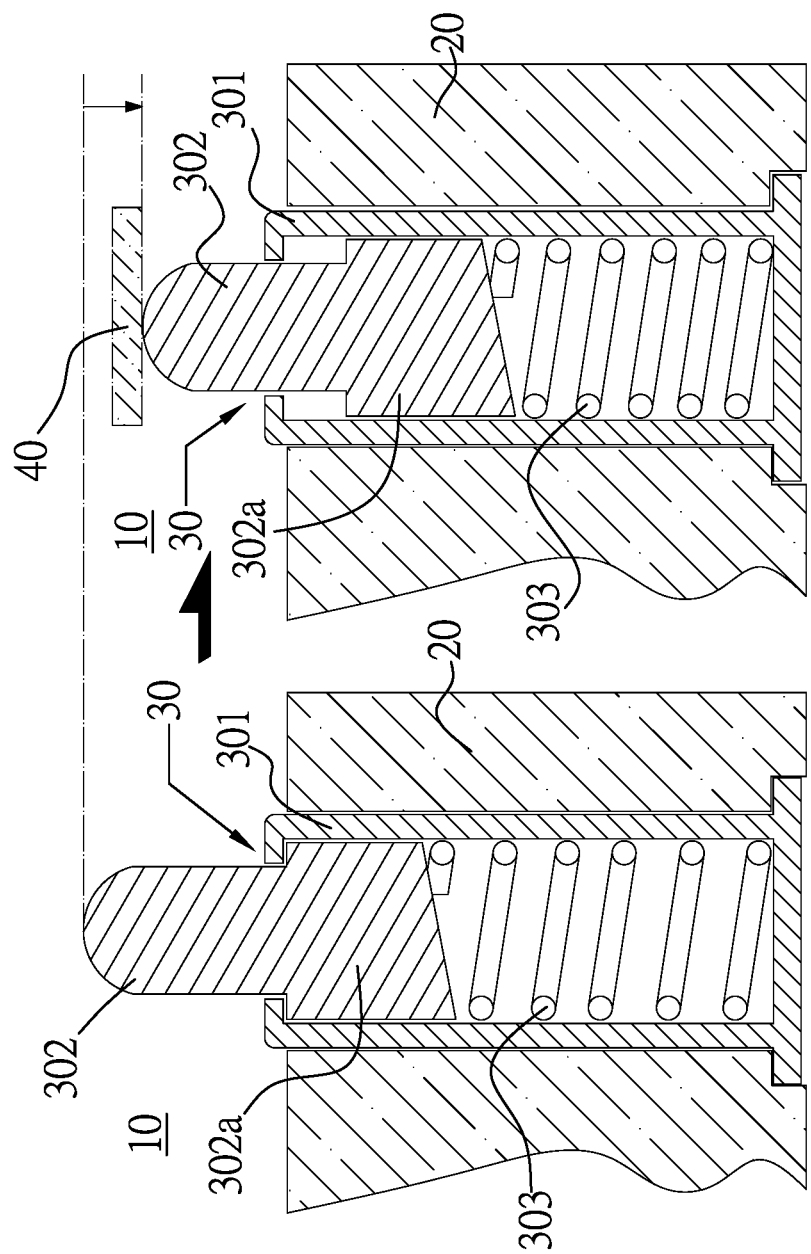
FIG. 1 is a schematic drawing showing operation of a conventional electrical connector with extension terminal.
Figure 2:
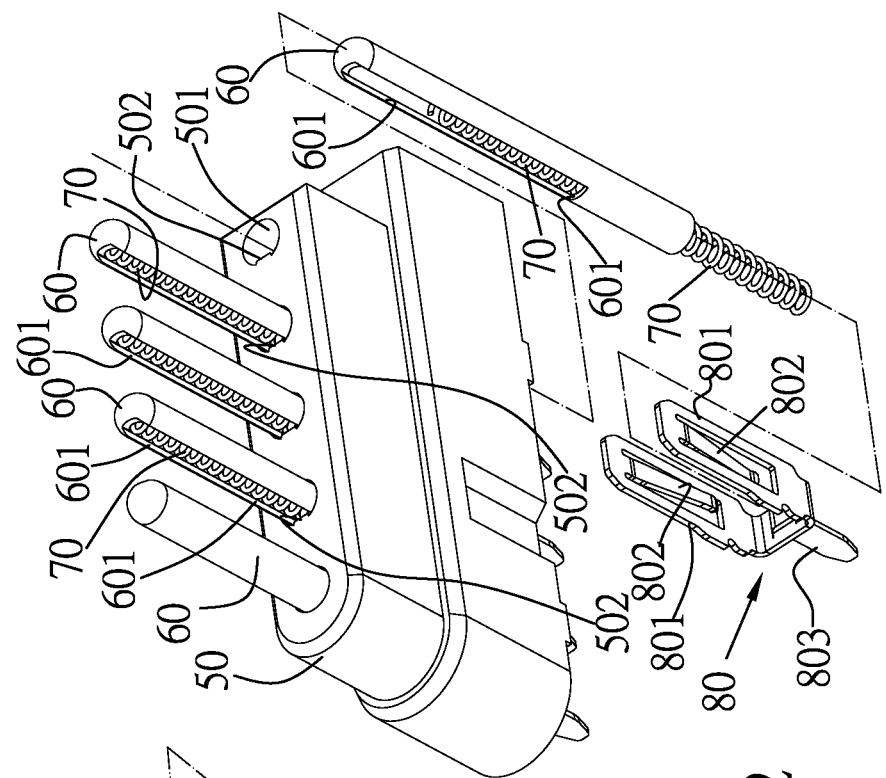
FIG. 2 is a partially exploded view of an electrical connector with extension terminals according to the present invention.
Figure 3:
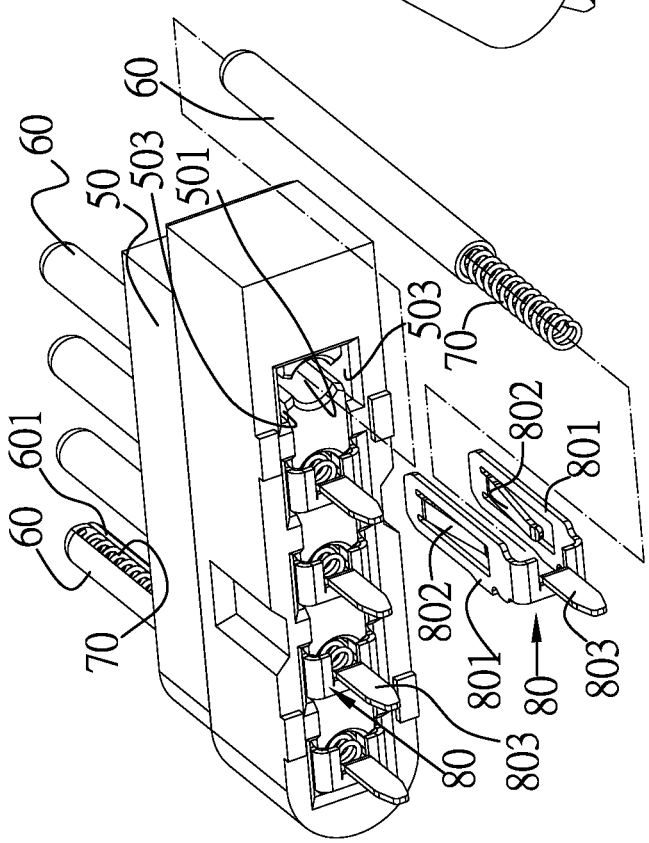
FIG. 3 is another partially exploded view of the electrical connector according to the present invention.

FIG. 2 is a perspective view of an electrical connector with extension terminals according to the present invention. Also referring to FIG. 3, the electrical connector comprises: an insulating housing 50, movable terminals 60, springs 70 and conductive reed terminals 80.

The insulating housing 50, as shown in FIGS. 3, 4, 5 and 6, is formed with terminal axial holes 501 passing therethrough according to the specification of the electrical connector in terms of terminal quantity and terminal arrangement. Each of the terminal axial holes 501 has the upper part of its wall formed with a ridge 502. Furthermore, at the bottom of the insulating housing 50, a plurality of reed sockets 503 communicated with the terminal axial hole 501 are formed around the terminal axial holes 501, respectively.

Additionally, the movable terminal 60, as shown in FIGS. 2, 3, 7, 8 and 9, has a tubular body accommodating therein a spring 70. The movable terminal 60 has a domed top formed as an abutting portion. The movable terminal 60 is further provided with a groove 601. The movable terminal 60 is configured to be such inserted into the terminal axial hole 501 of the insulating housing 50 that the groove 601 of the movable terminal 60 fittingly receives the ridge 502 at the wall of the terminal axial hole 501 of the insulating housing 50, thereby limiting the movable terminal 60 to move in the terminal axial hole 501 without the possibility of leaving from and rotating in the terminal axial hole 501.

Furthermore, as shown in FIGS. 2, 3, 5, 6, 8 and 9, the conductive reed terminal 80 is formed from a metal sheet and has a plurality of inserts 801 and a weld leg 803. The insert 801 has a reed 802. When the insert 801 of the conductive reed terminal 80 is inserted into the reed socket 503 of the insulating housing 50, the reed 802 of the insert 801 of the conductive reed terminal 80 abuts against the movable terminal 60 and conductivity is established therebetween.

FIG. 10 is a schematic drawing showing operation of the electrical connector with extension terminals according to the present invention. Also referring to FIG. 8, the movable terminal 60 of the electrical connector is pushed upward to its standby position under the counter-compression force by the spring 70, and the reed 802 of the insert 801 of the conductive reed terminal 80 abuts against the movable terminal 60 to establish conductivity therebetween. In use, the movable terminal 60 is aligned with and pushed toward the contact 40 of the electrical connector of an external device so as to establish conductivity therebetween. The movable terminal 60 when pressed comes down slightly, and at the same time the counter-compression force of the spring 70 continuously pushes the movable terminal 60 upward, thereby ensuring firm contact and reliable conductivity between the movable terminal 60 and the contact 40 of the electrical connector of the external device.

Moreover, the reed 802 of the insert 801 of the conductive reed terminal 80 abuts against the movable terminal 60 so that conductivity is established therebetween. The reed 802 has resilience and thus can continuously counteract the push force generated by the movable terminal 60 moving back and forth along the slightly off-axis path and firmly abut against the movable terminal 60, so as to ensure firm contact and reliable conductivity, thereby preventing the movable terminal 60 from getting stuck and being not able to move up and down.

What is claimed is:

1. An electrical connector with extension terminals, comprising an insulating housing, a movable terminal, a spring and a conductive reed terminal;

the insulating housing, being formed with terminal axial holes passing therethrough according to a specification of the electrical connector in terms of terminal quantity and terminal arrangement, each said terminal axial hole having an upper part of its wall formed with a ridge, the insulating housing at its bottom being provided with a plurality of reed sockets arranged around and communicated with the terminal axial holes, respectively;

the movable terminal, having a tubular body accommodating therein a spring, the movable terminal having a domed top formed as an abutting portion, the movable terminal being further provided with a groove, the movable terminal being configured to be such inserted into the terminal axial hole of the insulating housing that the groove of the movable terminal fittingly receives the ridge at the wall of the terminal axial hole of the insulating housing, thereby limiting the movable terminal to move in the terminal axial hole but preventing the movable terminal from leaving from and rotating in the terminal axial hole; and the conductive reed terminal, being formed from a metal sheet and having a plurality of inserts and a weld leg, the insert having a reed, when the insert of the conductive reed terminal is inserted into the reed socket of the insulating housing, the reed of the insert of the conductive reed terminal abutting against the movable terminal, thereby establishing conductivity therebetween.

* * * * *